United States Patent [19]

Kawasaki

[11] Patent Number: 5,418,636
[45] Date of Patent: May 23, 1995

[54] LIQUID CRYSTAL IMAGE DISPLAY APPARATUS WITH ANODIZED FILMS OF THE SAME THICKNESS AND A METHOD OF FABRICATING THE SAME

[75] Inventor: Kiyohiro Kawasaki, Hirakata, Japan

[73] Assignee: Matsushita Electric Industrial Co., Ltd., Osaka, Japan

[21] Appl. No.: 69,857

[22] Filed: Jun. 1, 1993

[30] Foreign Application Priority Data

Jun. 5, 1992 [JP] Japan .................. 4-145352

[51] Int. Cl.⁶ .................. G02F 1/1333; G02F 1/1343
[52] U.S. Cl. .......................................... 359/79; 359/59
[58] Field of Search .................. 359/59, 87, 54, 79

[56] References Cited

U.S. PATENT DOCUMENTS

| | | | |
|---|---|---|---|
| 4,778,258 | 10/1988 | Parks et al. | 350/336 |
| 4,889,411 | 12/1989 | Parks et al. | 350/334 |
| 5,054,887 | 10/1991 | Kato et al. | 359/59 |
| 5,124,823 | 6/1992 | Kawasaki et al. | 359/59 |
| 5,162,901 | 11/1992 | Shimada et al. | 359/59 |
| 5,187,602 | 2/1993 | Ikeda et al. | 359/59 |

FOREIGN PATENT DOCUMENTS

| | | |
|---|---|---|
| 5-9095514 | 6/1984 | Japan . |
| 2171726 | 7/1990 | Japan . |
| 2-216129 | 8/1990 | Japan . |
| 2216129 | 8/1990 | Japan . |
| 2240636 | 9/1990 | Japan . |
| 3-240027 | 10/1991 | Japan . |
| 3232274 | 10/1991 | Japan . |
| 4-43328 | 2/1992 | Japan .................. 359/87 |

Primary Examiner—Anita Pellman Gross
Assistant Examiner—Charles Miller
Attorney, Agent, or Firm—Ratner & Prestia

[57] ABSTRACT

A liquid crystal image display device is disclosed of a type comprising a first transparent insulating substrate having a plurality of scanning line, a plurality of signal lines and an insulated-gate transistor for each pixel and a pixel electrode for each pixel, a second transparent insulating substrate having a transparent electroconductive counterelectrode and positioned spaced a predetermined distance from the first substrate to define a chamber therebetween, and a liquid crystal material filled in the chamber. When a drain wiring connecting a drain of the insulated-gate transistor with the associated pixel electrode and each of said signal lines are formed, a connecting layer that connects between the drain wiring and the associated signal line is formed, followed by depositing a metallic layer, containing aluminum as a main component, over the connecting layer. Thereafter, the signal line and the drain wiring are selectively formed, followed by formation of a protective layer for protecting the connecting layer from anodization. After surfaces of the signal line and the drain wiring have been anodized to render them to be insulating, the protective layer is removed to disconnect the signal line from the drain wiring.

2 Claims, 6 Drawing Sheets

LIQUID CRYSTAL IMAGE DISPLAY APPARATUS WITH ANODIZED FILMS OF THE SAME THICKNESS AND A METHOD OF FABRICATING THE SAME

BACKGROUND OF THE INVENTION

1. Field of the Invention

The present invention relates to a liquid crystal panel having an image display capability and, more particularly, to a passivation effective in an active liquid crystal image display device having a plurality of switching elements one for each pixel built therein.

2. Description of the Prior Art

With a recent remarked development of a microprocessing technology, new liquid crystal material and a mounting technology, a liquid crystal panel practically effective to provide a televised picture though small in size, for example, 3 to 10 inches has been placed available in the market. The formation of R, G and B color layers on one of two glass substrates forming parts of the liquid crystal panel makes it possible for the liquid crystal panel to display color images, and a so-called active liquid crystal panel having built-therein a plurality of switching elements one for each pixel ensures a display of images of high contrast ratio with a minimized cross-talk. Such a liquid crystal panel generally includes a standard matrix of 242 to 480 scanning lines and 360 to 1,000 signal lines and is generally designed as shown in FIG. 6.

Referring to FIG. 6 for the discussion of the prior art liquid crystal panel, the liquid crystal panel, generally identified by 1, is so designed that electric signals can be supplied to an image display unit by means of a mounting means of a COG (Chip-on-glass) system wherein a semiconductor integrated circuit chip 3 for supplying drive signals to electrode terminals 6 of the scanning lines formed on one of transparent insulating substrates, for example, glass plates 2, forming parts of the liquid crystal display panel 1 or of a system wherein conductor films 4 including a thin film base made of, for example, polyimide resin and having terminals made of gold-plated copper foil are fixedly bonded to electrode terminals 5 of the signal lines by the use of a bonding agent.

While in FIG. 6 the two different mounting systems are simultaneously illustrated for the purpose of discussion, it is to be noted only one of them is in practice employed. Reference numerals 7 and 8 represents connecting lines that extend between the image display unit disposed at the center of the liquid crystal panel 1 and the electrode terminals 5 and 6 of the respective signal and scanning lines. These connecting lines may not necessarily be made of the same electroconductive material as that used for the electrode terminals.

Reference numeral 9 represents a glass plate forming the other of the transparent insulating substrates and having a counterelectrode common to all of pixels, said counterelectrode being made of transparent electroconductive material. The glass plates 2 and 9 are spaced a predetermined distance from each other and fixed in position by means of a spacer made of, for example, quartz fibers or plastics beads, with a sealed chamber defined therebetween for accommodating a mass of liquid crystal. Where a color display is desired, a surface of the glass plate 9 opposite to the liquid crystal layer is deposited with an organic thin film which is made of one or a mixture of dyes and pigments and which is generally referred to as a colored layer to provide the liquid crystal panel with a color display capability and, therefore, the glass plate 9 is generally referred to as a color filter. Depending on the nature of liquid crystal material employed, a polarizing substrate is fitted to one or both of an upper surface of the glass plate 9 and a lower surface of the glass plate 2 so that the liquid crystal panel 1 can function as an electro-optical element.

FIG. 7 illustrates an electric equivalent circuit of the active liquid crystal panel, shown in FIG. 6, wherein insulated-gate transistors 10 are disposed as the switching elements one for each pixel, and FIG. 8 shows a sectional representation of an essential portion of the active liquid crystal panel shown in FIG. 6. Elements shown by the solid lines represent those formed on the glass plate 2 while elements shown by the phantom lines represent those formed on the glass plate 9.

Scanning lines 11 (8) and signal lines 12 (7) are formed on the glass plate 2 in a predetermined pattern simultaneously with the formation of the thin-film transistors 10 of a type wherein films of silicon nitride ($Si_3N_4$) form gate insulating films and films of amorphous silicon form semi-conducting films. Liquid crystal cells 13 are constituted by transparent electroconductive pixel electrodes 14 formed on the glass plate 2 and a transparent electroconductive counterelectrode 15 on the color filter 9 and a layer of liquid crystal material 16 filled up in the space between the glass plates. These liquid crystal cells 13 are electrically treated as capacitors.

A colored layer 17 made of colored gelatin or colorable photosensitive resin includes a plurality of trios of R (red), G (green) and B (blue) regions, all of said trios of R, G and B regions being arranged on the surface of the color filter 9 adjacent the liquid crystal layer 16 in a predetermined pattern in correspondence with the pixel electrodes 14. A counterelectrode 15 common to all of the pixel electrodes 14 is formed on the colored layer 17 as shown in order to avoid a loss of voltage distribution which would occur in the presence of the colored layer 17. A polyimide resin layer 18 having a film thickness of, for example, 0.1 $\mu$m and deposited on the glass plates so as to confront the liquid crystal layer 16 is an orientation layer operable to orient liquid crystal molecules in a predetermined direction. Where the liquid crystal layer 16 is made of twisted nematic (TN) liquid crystal, two polarizing plates 19 are necessary on respective outer surfaces of the glass plates remote from the liquid crystal layer 16.

If an opaque film 20 having a low reflecting property is disposed at the boundary of the R, G and G colored layer 17, an undesirable reflection of rays of light from a wiring layers including the signal lines and other formed on the glass plate 2 can be minimized to increase a contrast ratio and, also, any possible increase of a leak current resulting from external irradiation of the switching elements 10 can be avoided to permit the liquid crystal panel to be operated under a bright environments lightened by a high intensity of light. This type of liquid crystal panel is known as a black matrix model and is currently placed on the market. While numerous designs can be contemplated for the black matrix liquid crystal panel, considering the condition under which steps are generated at the boundary of the colored layer and the light permeability, the use is convenient of a chromium (Cr) thin film having a film thickness of about 0.1 $\mu$m although it may result in an increase in cost.

It is to be noted that, although storage capacitances 21 shown in FIG. 7 are not always elements essential to the active liquid crystal panel, they are suitably employed as they are effective to improve the efficiency of utilization of a driving signal source, to suppress a disturbance of stray and parasitic capacitances and to avoid a flickering of the image which would tend to occur when the liquid crystal panel is operated at an elevated temperature. Also, for the sake of facilitating an easy understanding, the thin-film transistors 10, the scanning lines 11, the storage capacitances 21 and other important elements such as a light source and spacers are not shown in FIG. 8. Reference numeral 22 represents thin-film conductors used to connect the pixel electrodes 14 and respective drains of the insulated-gate transistors 10, which are generally made of the same material as that for the signal lines 12.

In the prior art active liquid crystal panel, the device structure is too complicated for the liquid crystal cells 13 to drive under equal conditions and, therefore, a glittering of the image displayed thereby is apt to occur. This glittering is also referred to as a flickering and is well known to occur even in a simple matrix type liquid crystal panel when the displayed image is viewed slantwise and/or when the drive signal contains a substantial amount of the direct current component.

In order to reduce the flickering, two solutions have been suggested. One is to fabricate the liquid crystal cells 13, the insulated-gate transistors 10 and the storage capacitances 21 with high precision so that all of the liquid crystal cells can be driven under equal conditions, and the other is to drive each neighboring members of the liquid crystal cells 13 in respective phases opposite to each other so that the flickering will not be substantially noticed visually over the entire surface of the liquid crystal panel as a whole.

The first mentioned solution has, however, been found having a problem in that, not only are stringent fabrication conditions required to fabricate active substrates and panels, but also the necessity of a relatively large storage capacitance tends to reduce the yield and the aperture.

On the other hand, the second mentioned solution has also been found having a problem in that, although the flickering can be reduced apparently, a higher signal voltage is required for driving while the counterelectrode 15 is maintained at a predetermined voltage and, accordingly, the liquid crystal is apt to be deteriorated, as it is used for a long time, to be browned because of the presence of minute variations among liquid crystal cells, which constitute a cause of flickering, and the increase of the direct current voltage component. This in turn results in a reduction in quality of the image displayed.

If as shown in FIG. 8 the orientation films 18 which are organic thin-films were to work out their insulating capability thereby to insulate surfaces of electroconductive electrodes such as the signal lines 12, the drain wiring conductors 22 and the pixel electrodes 14, no direct current would flow into the liquid crystal cells 13 comprised of the pixel electrodes 14, the counterelectrode 15 and the liquid crystal layer 16 and, hence, no deterioration should occur in the liquid crystal layer 16. The reality is, however, that the deterioration of the liquid crystal layer 16 is more or less unavoidable because each orientation film 18 has a film thickness small of about 0.1 μm as hereinbefore described, is susceptible to pinholes due to the general use of an offset printing technique to form it and is cured at a relatively low temperature, say, 300° C. or lower and because each orientation film 18 is therefore unable to completely insulate the surfaces of the signal lines 12, the drain wiring conductors 22 and the pixel electrodes 14.

Specifically, since the signal voltage is continuously supplied to the signal lines 12 from an external source, a direct current component flows between the signal lines 12 and the counterelectrode 15. Therefore, it will readily be understood that, if in place of the orientation films, a transparent insulating film 23 made of, for example, $Si_3N_4$ is coated over the entire surface of the active substrate 2 to a film thickness of about 0.5 μm as shown in FIG. 9, deterioration of the liquid crystal layer 16 can be avoided.

However, the formation of the passivation layer 23 over the entire surface of the substrate is generally considered undesirable since it increases the process time and, also, the presence of the insulating layer over the pixel electrode lowers the voltage to be applied to the liquid crystal layer 16. Although with respect to the latter portions of the passivation layer 23 over the pixel electrodes 14 can be selectively removed, the presence of high steps of the passivation layer overlaying or in the vicinity of the pixel electrodes 14 makes it difficult to achieve a regular rubbing of the orientation films 18 with a dry cloth, resulting in a disorder of the liquid crystal molecules. This is in turn accompanied by such a side effect that the quality of the image displayed is lowered as a result of a reverse domain.

Also, the heat resistance of each insulated-gate transistor is another important factor to be taken into consideration during the fabrication of the passivation layer. By way of example, the substrate is required to be heated to a temperature equal to or higher than 250° C. when SiNx is desired to be deposited with the use of P-CVD technique. Under such a high temperature, it is not rare that various characteristics of each insulated-gate transistor are deteriorated as a result of the heating. This is partly because hydrogen separates from an a-Si film and partly because the source-drain wirings made of Al protrude through an impurity-containing a-Si layer to form an alloy with the impurity-free a-Si layer thereby to adversely affect the ohmic property of the source-drain region of each transistor. In either case, those phenomenons are undesirable if properties of the liquid crystal panel are desired to be secured.

SUMMARY OF THE INVENTION

The present invention has been devised with a view to substantially eliminating the various problems discussed hereinabove and is intended to provide an improved liquid crystal image display apparatus, and a method of manufacturing the same, wherein an anodization process is employed to selectively isolate only the signal lines, made of aluminum, and the drain wiring conductors.

According to the present invention, the isolation of the signal lines and the drain wiring conductors can be accomplished by forming an $Al_2O_3$ (alumina) over the signal lines and the drain wiring conductors by the use of the anodization process. Since the alumina thin film, which is an electrically insulating film, is selectively formed over the signal lines and the drain wiring conductors, the voltage to be applied to the liquid crystal layer will not be reduced. Also, not only can the fabrication be accelerated because no process step of forming the passivation layer is required, but also the heat resistance of each insulated-gate transistor will not be adversely affected.

BRIEF DESCRIPTION OF THE DRAWINGS

This and other objects and features of the present invention will become clear from the following description taken in conjunction with preferred embodiments thereof with reference to the accompanying drawings, in which like parts are designated by like reference numerals and in which.

DETAILED DESCRIPTION OF THE EMBODIMENTS

While preferred embodiments of the present invention will be described with reference to FIGS. 1 to 5, the present invention requires a special consideration in device structure and patterning since a source wiring conductor (a signal line) and a drain wiring conductor of each insulated-gate transistor are equally insulated and, therefore, a combination of electric equivalent circuit diagram, patterning diagram and sectional representation is shown in FIGS. 2 and 3.

Figure 2A:
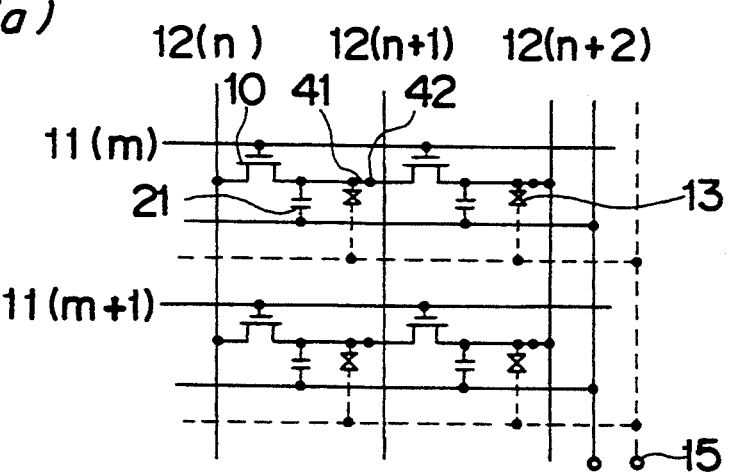
FIG. 2(a) is an electric equivalent circuit diagram of the liquid crystal image display device shown in FIG. 1.

Referring first to the electric equivalent circuit diagram shown in FIG. 2(a), for the convenience that a sufficient forming current can flow through the drain wiring conductor of each insulated-gate transistor 10, the drain at a (m, n) address location is shown to be connected with one signal line at a (m, n+1) address location through a connecting line 41. This connecting line 41 must have a break point 42 so that, during a subsequent process step, the break point 42 can be removed to disconnect the drain at a (m, n) address location from the signal line at a (m, n+1) address location.

Figure 2B:
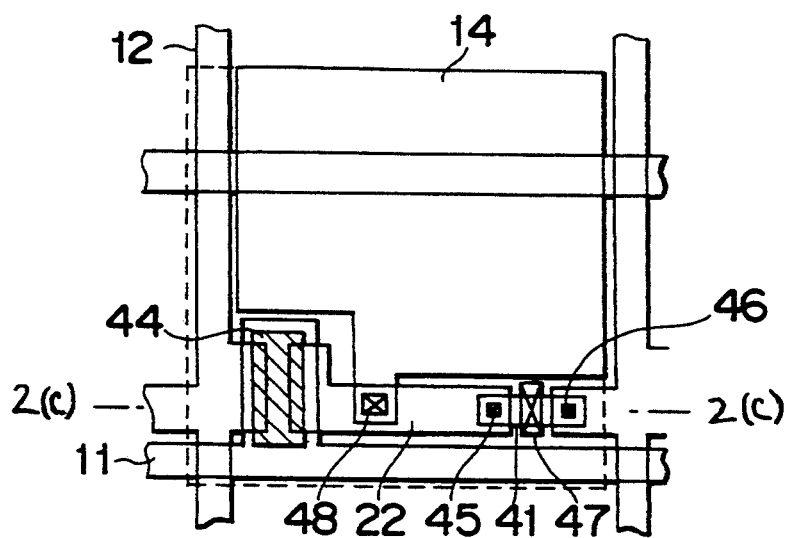
FIG. 2(b) is a schematic diagram showing, on an enlarged scale, a portion of the wiring pattern in the liquid crystal image display device.

A specific wiring pattern is shown in FIG. 2(b). FIGS. 2(c) to 2(h) illustrate, on an enlarged scale, a cross-section taken along the line 2(a)–2(c) shown in FIG. 2(b), showing the sequence of fabrication which will now be described briefly.

Figure 2C:
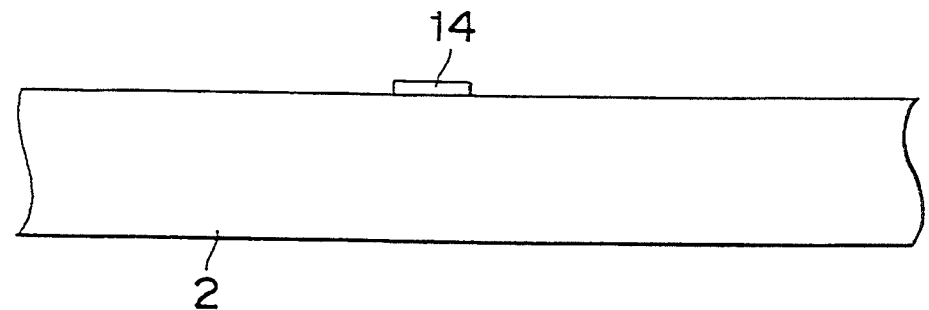
FIGS. 2(c) to 2(h) are schematic side sectional views, respectively, showing the sequence of fabrication of the liquid crystal display device according to the present invention.
Figure 2D:
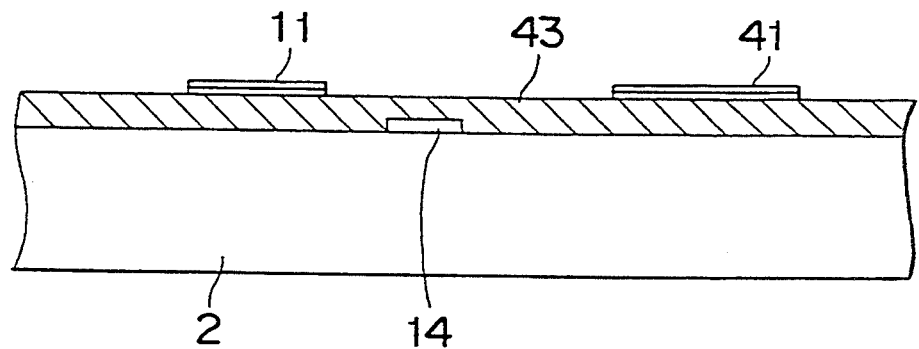

As shown in FIG. 2(c), a transparent insulating substrate, for example, a glass plate 2, has one of opposite major surfaces formed selectively with a pixel electrode 14 of 0.1 μm in film thickness made of, for example, ITO. After as shown in FIG. 2(d), for example, a CVD-SiO$_2$ film 43 has subsequently been deposited to a film thickness of 0.1 μm over the entire surface of the glass plate 2 to avoid a physical and/or chemical impairment during the P-CVD process, a scanning line 11 (a portion of which forms a gate of the insulated-gate transistor) of, for example, 0.1 μm in film thickness made of Cr and a connecting pattern 41 are selectively formed after deposition. The connecting pattern 41 may not be made of the same material as that for the scanning line 11 and, because of the reason which will be described later, may be made of gold or platinum which is hard to oxidize, but it appears recommendable to employ the same material as that for the scanning line 11 in order to keep the process time as short as possible.

Thereafter, using the P-CVD technique, a SiNx film 49 of, for example, 0.4 μm in film thickness, an a-Si film 50 of, for example, 0.1 μm substantially free from impurities, and a SiNx film 44 of, for example, 0.1 μm are successively formed. Then, after the SiNx film which is the uppermost layer has been partially left and an etching stopper 44' has subsequently been formed, an a-Si film 51, containing P as an impurity, is formed over the entire surface by the use of the P-CVD technique as shown in FIG. 2(e).

Figure 2E:
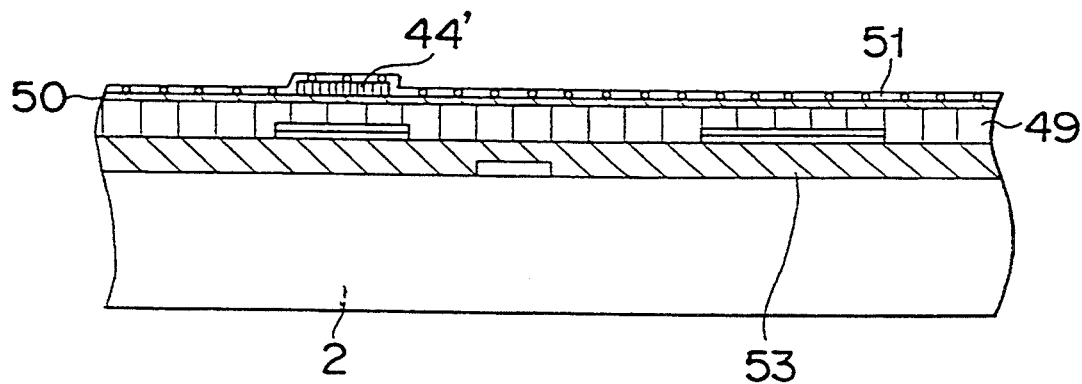
Figure 2F:
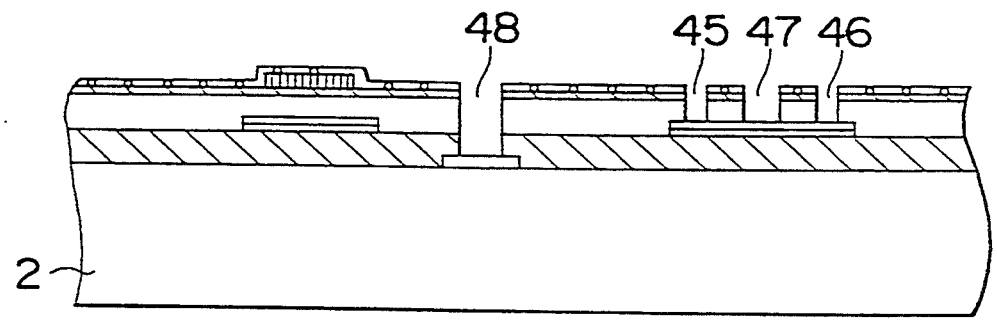

After the formation of the a-Si film 51 as shown in FIG. 2(e), a cavity (not shown) for connection to the scanning line 11, cavities 45 and 46 for connection between a signal line 12 and both of the connecting pattern 41 and the drain, a cavity 47 through which the connecting pattern 41 is partially etched off, and a cavity 48 for connection with a corresponding pixel electrode 14 are formed as shown in FIG. 2(f). While in the illustrated embodiment it is suggested that the impurity-containing a-Si film 51, the impurity-free a-Si film 50, the gate insulating SiNx film 49 and SiO$_2$ film 43, in the order from the outermost layer remote from the glass plate 2, are removed at a time, a dry etching such as represented by RIE is an effective means for such a multi-layered structure.

Figure 2G:
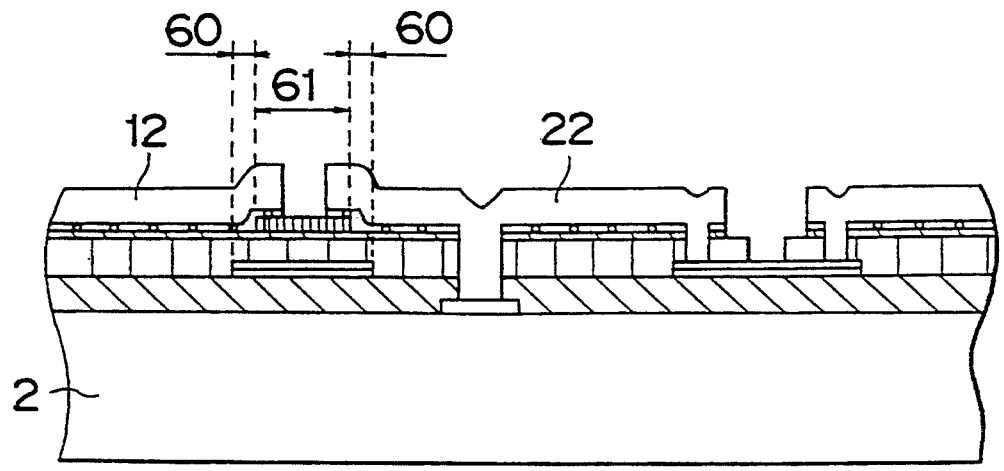

Subsequent to the formation of the various cavities, a metallic layer comprising, as a main component, aluminum is deposited over the entire surface, followed by a selective formation of the signal line 12 and the drain wiring conductor 22 including the cavities. A condition in which, while the signal line 12 and the drain wiring conductor 22 are used as a masking medium, unnecessary portions of the impurity-containing a-Si film have been removed is shown in FIGS. 2(b) and 2(g).

Since in FIG. 2, the insulated-gate transistor is formed without the impurity-containing and impurity-free a-Si films being configured in the form of an island, it will readily be understood that portions of the impurity-containing a-Si film which are aligned with regions 60 where the gate 11 and both of the source wiring conductor 12 and the drain wiring conductor 22 overlap with each other in a planar fashion constitute the source and the drain, respectively. Similarly, a region of the impurity-free a-Si film where the gate 11 and the etching stopper 44' overlap with each other in a planar fashion constitutes a channel of the insulated-gate transistor.

Figure 2H:
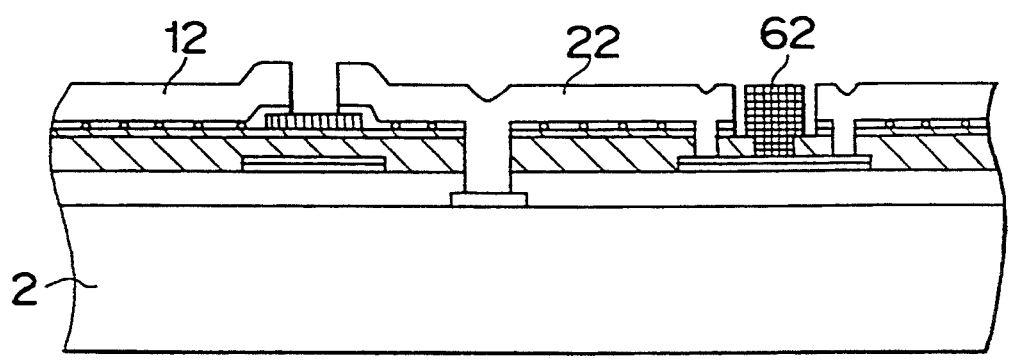

According to the present invention, although an anodization is carried out subsequently, in order for Cr of the connecting pattern 41 within the cavity 47 to protect from being oxidized, the cavity 47 is conveniently covered by a suitable protective film, for example, a photosensitive resin pattern 62 as shown in FIG. 2(h) prior to the anodization process.

Figure 1:
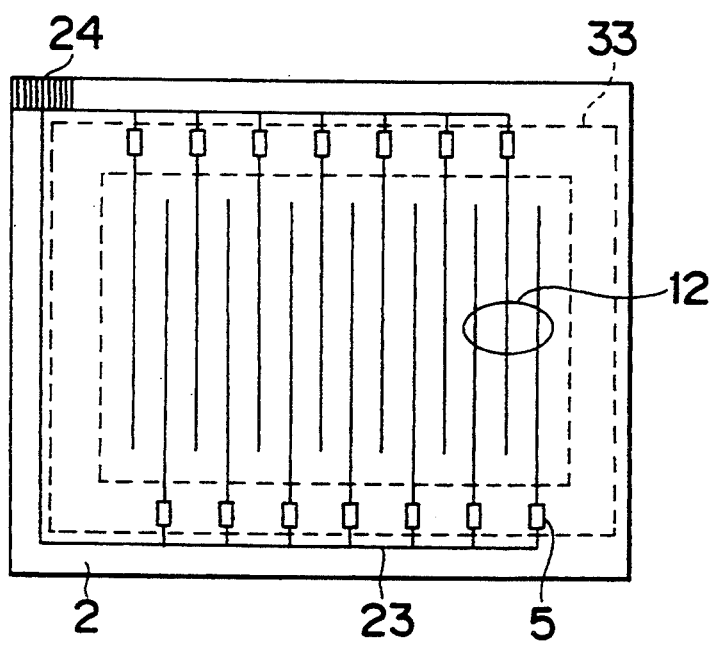
FIG. 1 is a schematic diagram showing a wiring pattern on an active substrate employed in a liquid crystal image display device according to a first preferred embodiment of the present invention.

The pattern formed on the active substrate 2 forming a part of the liquid crystal image display device according to the foregoing embodiment of the present invention is shown in FIG. 1. It is however to be noted that, for the sake of brevity, only the signal lines 12 are illustrated and the drain wiring conductors 22 are not shown in FIG. 1. As is well known to those skilled in the art, during execution of the anodization, all of the wirings over which an oxide film is desired to be grown must be electrically connected together and, therefore, the signal lines are connected through terminal electrodes 5 with a common connecting line 23 which is in turn connected with a conductor strip 24 which is a solid pattern of a peripheral region of the glass plate 2. The solid pattern referred to has a relatively large surface area enough to ensure a firm electric contact when the substrate is clipped using a metallic jig such as, for example, a clip. It is possible to connect the signal lines directly with the common connecting line 23 without extending via the terminal electrodes 5 and, also, where there is a possibility that the terminal electrodes 5 may be modified in quality during the anodization, it falls within matter of process design to protect the terminal electrodes 5 with deposits of photosensitive resin pattern as is the case with the cavity 47 covered by the photosensitive resin pattern 62. Both of the connecting line 23 and the conductor strip 24 is made of the same aluminum as that for the signal lines 12.

Figure 4:
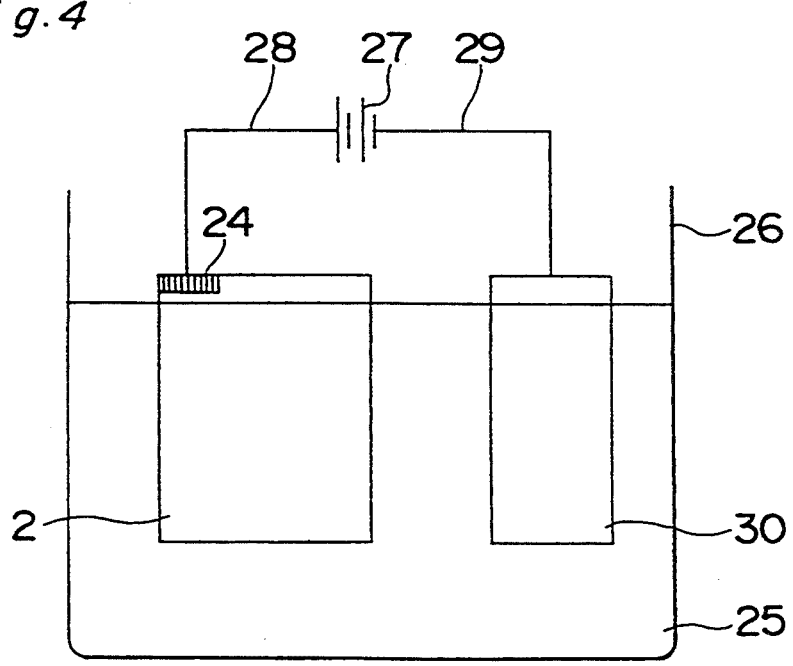
FIG. 4 is a schematic diagram showing an apparatus used to carry out an anodization process according to the present invention.
Figure 5A:
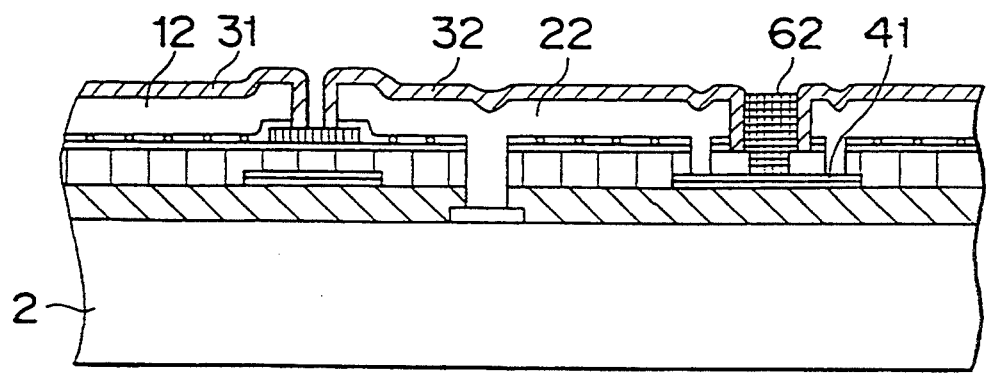
FIGS. 5(a) and 5(b) are schematic side sectional views, respectively, showing the details of an active substrate forming a part of the liquid crystal display device of the present invention.

Referring now to FIG. 4, the active substrate 2 shown in FIG. 2 is immersed in a vessel 26 filled with a quantity of forming solution 25. A direct current source 27 has a positive (+) terminal 28 connected with the conductor strip 24 of the active substrate 2 by means of a jig such as, for example, a clip, and a negative (−) terminal 29 connected with a gold or platinum electrode plate 30. When aluminum is to be anodized, it is well known to those skilled in the art that the use of the forming solution containing, as a main component, oxalic acid or sulfuric acid will result in a growth of porous aluminum oxide (alumina, $Al_2O_3$) while the use of ethylene glycol forming solution containing boric acid will result in a growth of non-porous fine alumina. The details of the aluminum anodization may be had from the Japanese Patent Publication No. 59-34798. In any event, when the anodization is carried out under conditions in which the density and the temperature of the forming solution are fixed, the film thickness to which an oxide film grows depends on the forming voltage and, therefore, by suitably choosing conditions for the anodization, it is extremely easy to form alumina films 31 and 32 of 0.1 to 0.3 μm in film thickness over the drain wiring conductors 22 and the signal lines 12 made of Al and having a film thickness of, for example, 1 μm as shown in FIG. 5(a).

Figure 5B:
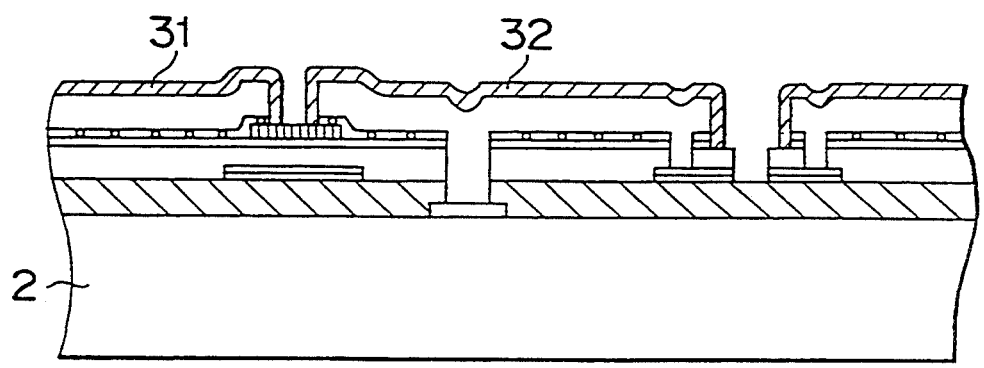
Figure 6:
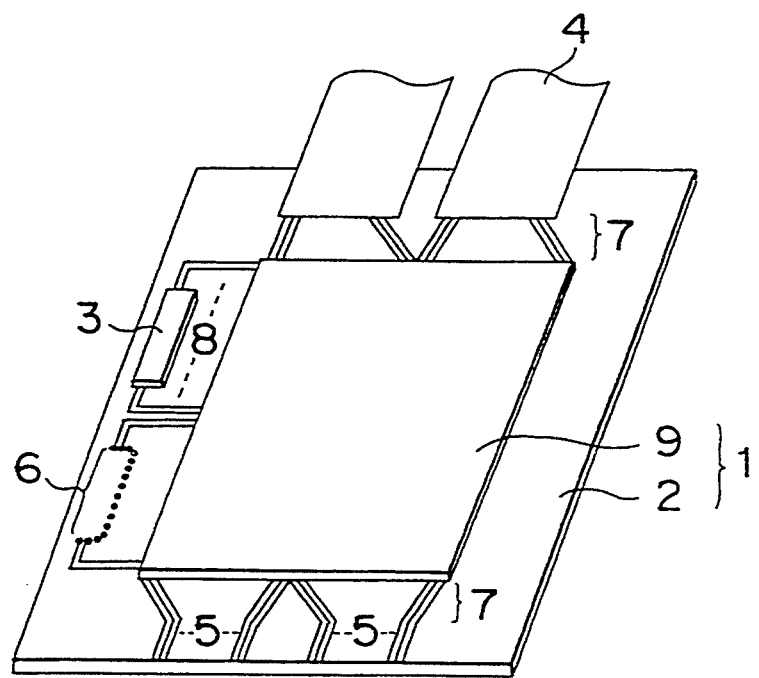
FIG. 6 is a perspective view of the prior art liquid crystal panel, showing a mounting means.
Figure 7:
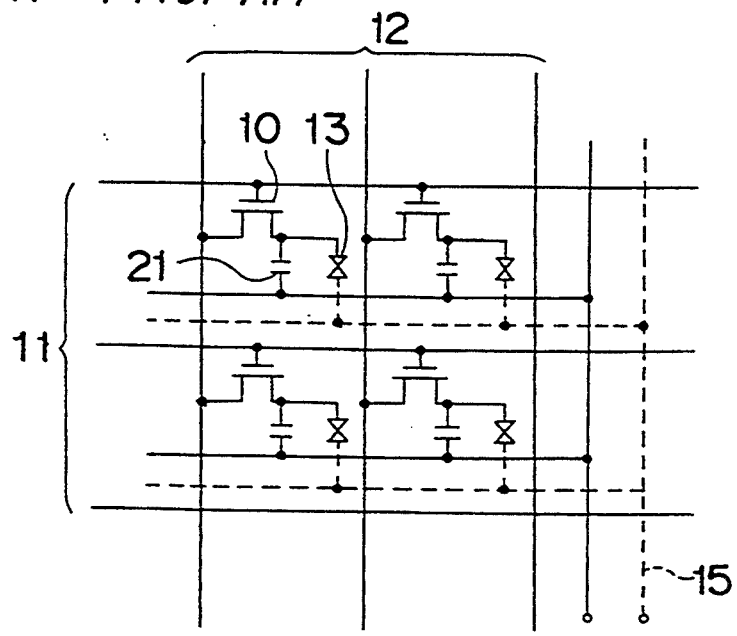
FIG. 7 is an electric equivalent circuit diagram of the prior art liquid crystal panel.
Figure 8:
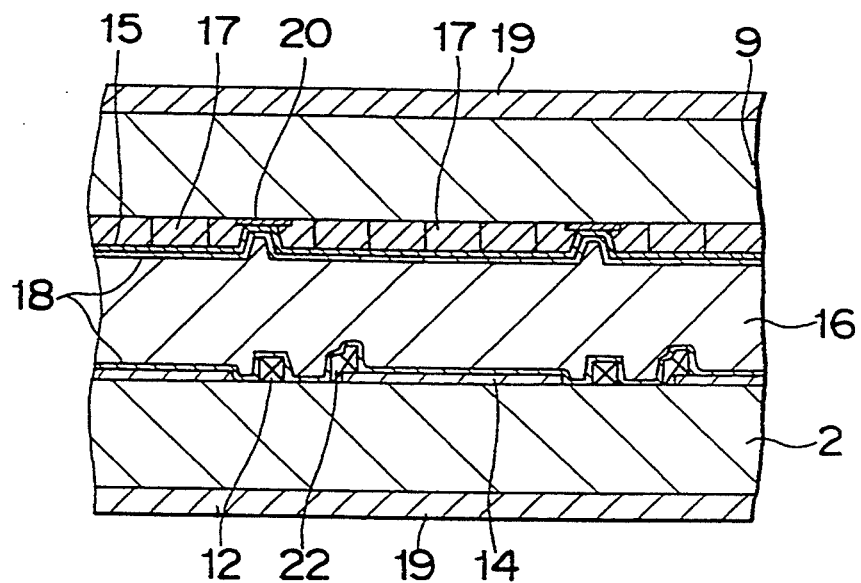
FIG. 8 is a fragmentary side sectional view of the prior art liquid crystal panel.
Figure 9:
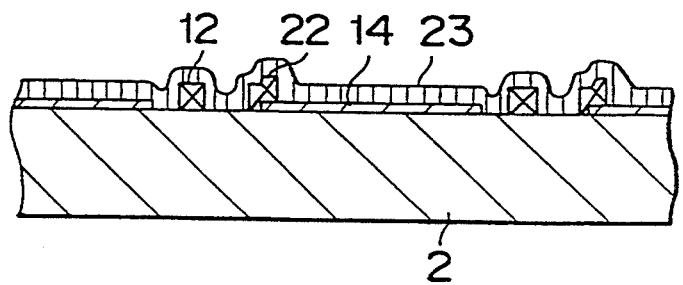
FIG. 9 is a fragmentary side sectional view, on an enlarged scale, showing an active substrate employed in the prior art liquid crystal panel.

After the anodization, the photosensitive resin pattern 62 is removed and, after the connecting pattern 41 has been partially etched off in a chromium etching solution to disconnect the drain of each insulated-gate transistor and the signal lines as shown in FIG. 5(b), the active substrate 2 has to be cut along the cutting line 33 thereby to provide a complete active substrate 2 wherein the electrode terminals 5 are isolated from each other consequent upon cutting of the connecting line 23.

Where each electrode terminals is too small for the purpose of rendering them to cope with the COG, it is difficult to accomplish an isolation of the electrode terminals by cutting the connecting line 23. In such case, if a photosensitive resin pattern is selectively formed on portions of the connecting line 23 and is then be, after the anodization, removed, followed by a selective removal of aluminum with the resultant alumina film used as an etching mask, the electrode terminals 5 can be isolated from each other upon cutting of the connecting line 23 to provide the complete active substrate 2.

An alternative method would be to make the connecting line 23 as a multi-layered wiring by arranging in a series a plurality of connecting patterns having cavities similar to that connecting pattern 41 within the pixels, then to introduce photosensitive resin patterns for the anodization protection and finally to effect an etching with chromium to disconnect the connecting lines.

In either case, it may be said to fall within matter of process design which one of these methods is to be employed.

A combination of electric equivalent circuit diagram, patterning diagram and sectional representation according to another embodiment of the present invention is shown in FIGS. 3(a) to 3(d).

Figure 3A:
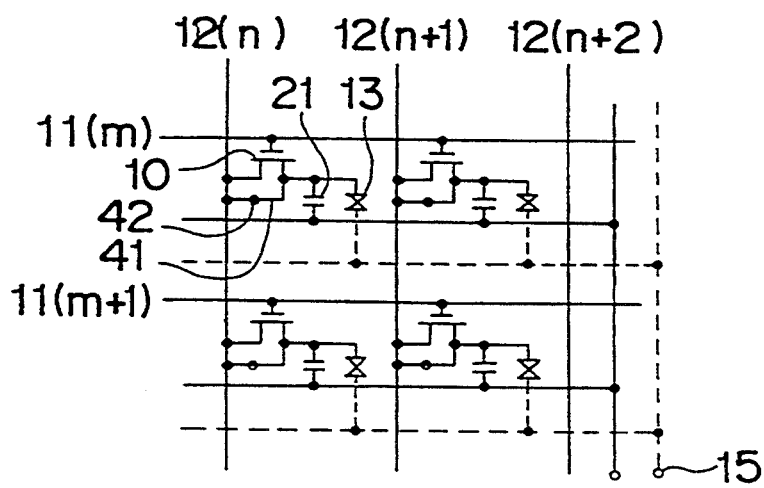
FIG. 3(a) is an electric equivalent circuit diagram of the liquid crystal image display device according to a second preferred embodiment of the present invention.

In the electric equivalent circuit diagram shown in FIG. 3(a), for the convenience that a sufficient forming current can flow through the drain wiring conductor of each insulated-gate transistor 10 as well, the drain at a (m, n) address location is shown to be connected with one signal line at a (m, n) address location through a connecting line 41, that is, the source and the drain thereof are short-circuited. This connecting line 41 must have a break point 42 so that, during a subsequent process step, the break point 42 can be removed to disconnect the drain at a (m, n) address location from the signal line at a (m, n) address location.

Figure 3B:
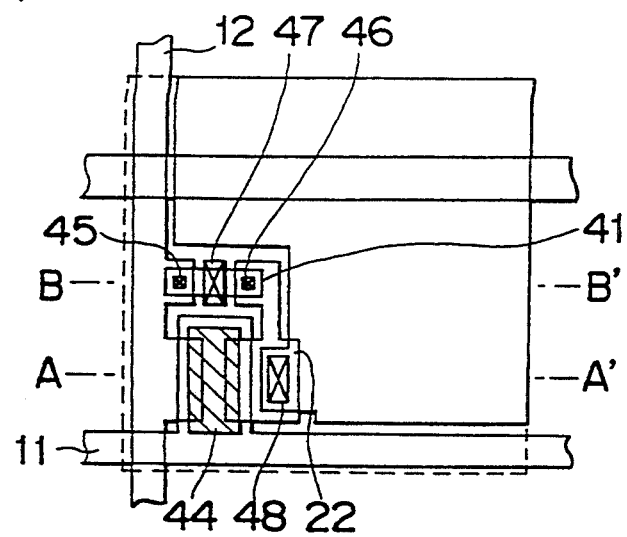
FIG. 3(b) is a schematic diagram showing, on an enlarged scale, a portion of the wiring pattern in the liquid crystal image display device according the second embodiment of the present invention.
Figure 3C:
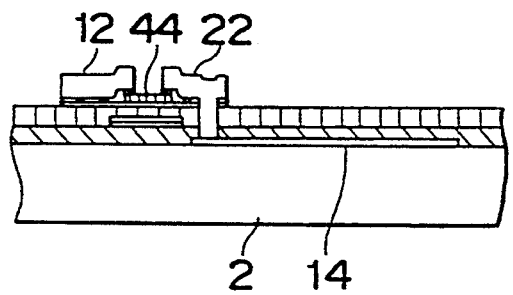
FIGS. 3(c) and 3(d) are schematic side sectional view, respectively, showing the sequence of fabrication of the liquid crystal image display device shown in FIG. 3(a)
Figure 3D:
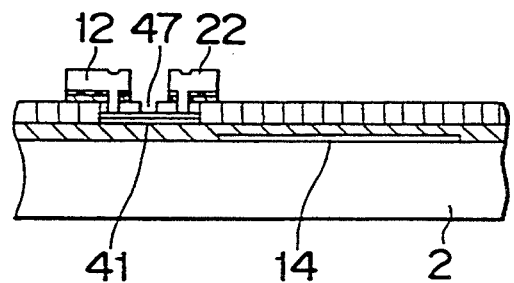

A specific patterning of the second embodiment of the present invention is shown in FIG. 3(b), and respective cross-section of the active substrate 2 taken along the lines A–A' and B–B' in FIG. 3(b) are shown in FIGS. 3(c) and 3(d). Since the method of fabrication is substantially similar to that described in connection with the first preferred embodiment of the present invention, the details thereof will not be reiterated for the sake of brevity.

As hereinbefore fully described, in accordance with the present invention, respective surfaces of the drain wiring conductors and the signal lines made of Al are modified into electrically insulating alumina films in order to isolate the direct current component which tends to deteriorate the liquid crystal when leaking into the liquid crystal cell. Because of this, the problem that the liquid crystal layer is deteriorated to such an extent that the image displayed is colored brown even though a high signal voltage is applied with the use of a flickerless drive system has successfully been solved. Also, by rendering only surfaces of the signal lines and the drain wiring conductors to be insulating, it is possible to avoid a lowering (about 0.3 to 1.0 volt depending on the film thickness of the transparent insulating thin film) of the voltage effectively supplied to the liquid crystal cell as compared with the entire passivation with the prior art transparent insulating thin film and, therefore, there is absolutely no possibility that the image being displayed may be darkened, and a factor by which the orientation of the orientation films is adversely affected is eliminated. In addition, with the passivation according to the present invention, no special heating process (at 250° to 300° C.) is employed and, therefore, the insulated-gate transistor may suffices not to have an excessively high heat resistance.

So long as the structure of the active substrate is concerned, the position where the pixel electrodes are formed in a direction across the thickness thereof is greatly affected by the structure of the insulated-gate transistors and the method of fabricating them. While in the foregoing description, the pixel electrodes have been shown and described as positioned in the lowermost layer closest to the active substrate, they may be positioned in the outermost layer remotest from the active substrate. Where the pixel electrodes are positioned in the outermost layer, the present invention teaches that no insulating layer exist above the pixel electrodes. Since the pixel electrodes are selectively conducted to the signal lines by means of the insulated-gate transistors, the drain wiring conductors connecting between the pixel electrodes and the insulated-gate transistors and the pixel electrodes may not always have their surface rendered to be insulating, the presence of any defect which would keep the insulated-gate transistor switched on at all time would constitute a possible cause of deterioration of the liquid crystal in the vicinity of such insulated-gate transistor and, therefore, not only the pixel electrodes, but also the drain wiring conductors be preferably insulated in accordance with the teachings of the present invention.

By a similar reasoning, the pixel electrodes when not positioned n the outermost layer on the active substrate, but at least partly covered by the transparent insulating $SiO_2$ or $Si_3N_4$ are effective to eventually provide a highly reliable liquid crystal image display device. Where the signal lines do not concurrently serve as source wiring conductors of the insulated-gate transistors and are not covered by the insulating films, it is quite natural that the treatment similar to that effected to the signal lines is required to the source wiring conductors.

The basic idea of the present invention is nevertheless equally applicable to the case in which the structure of the insulated-gate transistor is reverse to that described above with the respective gates positioned in the outermost layer. Similarly, it is added that, even though the active element is not the insulated-gate transistor, but a two-terminal diode or a non-linear element, the present invention is equally applicable thereto depending on design of patterning.

Also, while reference has been made in the foregoing description to the use of aluminum as material for the signal lines, an aluminum alloy containing a small quantity of any other metal, for example, a several percents of Si may be employed as material for the signal lines in consideration of migration and bondability, provided that the insulating property of the anodized film will not be lowered to an extent as to result in, for example, the breakdown voltage being about 1/10 of that exhibited where aluminum itself is employed.

Furthermore, although in the foregoing description reference has been made to the use of Cr as material for the scanning lines, it may not be always limited thereto and Mo, Ta or Al may equally be employed therefor. It is also evident that, where material of a kind hard to form an oxide film consequent upon anodization is employed for the scanning lines, no protective film is necessary during the anodization.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A liquid crystal display device comprising:
   a liquid crystal image display device of a type comprising a first transparent insulating substrate having a plurality of scanning line;
   a plurality of signal lines and an insulated-gate transistor for each pixel and a pixel electrode for each pixel, a second transparent insulating substrate having a transparent electroconductive counterelectrode and positioned spaced a predetermined distance from the first substrate to define a chamber therebetween; and
   a liquid crystal material filled in said chamber,
   wherein a drain wiring connecting a drain of the insulated-gate transistor with the associated pixel electrode and each of said signal lines are made of a metallic layer containing aluminum as a main component; and
   wherein anodized films of the same thickness are formed over said metallic layers and are electrically insulated from the liquid crystal material.

2. A method of fabricating a liquid crystal image display device of a type comprising a first transparent insulating substrate having a plurality of scanning line, a plurality of signal lines and an insulated-gate transistor for each pixel and a pixel electrode for each-pixel, a second transparent insulating substrate having a transparent electroconductive counterelectrode and positioned spaced a predetermined distance from the first substrate to define a chamber therebetween, and a liquid crystal material filled in said chamber, which method comprises the steps of:
   when a drain wiring connecting a drain of the insulated-gate transistor with the associated pixel electrode and each of said signal lines are formed, forming a connecting layer that connects between the drain wiring and the associated signal line;
   subsequently depositing a metallic layer, containing aluminum as a main component, over the connecting layer;
   selectively forming the signal line and the drain wiring;
   forming a protective layer for protecting the connecting layer from anodization;
   anodizing surfaces of the signal line and the drain wiring to render them to be insulating; and
   removing the protective layer to disconnect the signal nal line from the drain wiring.

* * * * *

UNITED STATES PATENT AND TRADEMARK OFFICE
CERTIFICATE OF CORRECTION

PATENT NO.   : 5,418,636
DATED        : May 23, 1995
INVENTOR(S)  : Kawasaki

It is certified that error appears in the above-identified patent and that said Letters Patent is hereby corrected as shown below:

Column 10, line 45, delete the hypen "-" between the words "each pixel".

Signed and Sealed this

Nineteenth Day of September, 1995

*Attest:*

BRUCE LEHMAN

*Attesting Officer*        *Commissioner of Patents and Trademarks*